(12) United States Patent
Lin et al.

(10) Patent No.: US 7,382,172 B2
(45) Date of Patent: Jun. 3, 2008

(54) LEVEL SHIFT CIRCUIT AND METHOD FOR THE SAME

(75) Inventors: Pao-Chuan Lin, Yuin-Lin Shien (TW);
Hung-Der Su, KaoHsung Shien (TW);
An-Tung Chen, Ping-Jeng (TW);
Jing-Meng Liu, HsinChu (TW)

(73) Assignee: Richtek Technology Company Ltd, Hsin-Chu (TW)

( * ) Notice: Subject to any disclaimer, the term of this patent is extended or adjusted under 35 U.S.C. 154(b) by 0 days.

(21) Appl. No.: 11/497,587

(22) Filed: Aug. 2, 2006

(65) Prior Publication Data
US 2007/0290736 A1    Dec. 20, 2007

(30) Foreign Application Priority Data
Jun. 16, 2006    (TW) ............................... 95121719 A
Jun. 26, 2006    (TW) ............................... 95122942 A (51) Int. Cl.
*H03L 5/00*    (2006.01)
(52) U.S. Cl. ........................... 327/333; 326/64; 326/81
(58) Field of Classification Search ................ 327/306, 327/333; 326/80–81, 62–64
See application file for complete search history.

(56) References Cited

U.S. PATENT DOCUMENTS

| | | | |
|---|---|---|---|
| 5,936,432 A * | 8/1999 | Oh et al. ....................... | 327/55 |
| 6,556,047 B2 * | 4/2003 | Debaty ......................... | 326/68 |
| 7,148,735 B2 * | 12/2006 | Ito et al. ...................... | 327/333 |

* cited by examiner

*Primary Examiner*—Dinh T. Le
(74) *Attorney, Agent, or Firm*—Tung & Associates (57) ABSTRACT

The present invention discloses a level shift circuit which comprises: level shift means for receiving an input of a first operational voltage and generating an output of a second operational voltage; and a current path connecting with a source of the second operational voltage and providing current to the output of the level shift means to speed up output level switching. The circuit preferably further comprises a power consumption control circuit for stopping excess power consumption when the output of the level shift means has substantially accomplished level switching.

7 Claims, 7 Drawing Sheets

LEVEL SHIFT CIRCUIT AND METHOD FOR THE SAME

BACKGROUND OF THE INVENTION

1. Field of the Invention

The present invention relates to a level shift circuit, and in particular to a level shift circuit with faster output level switching, and a method for the same.

2. Description of the Related Art

Figure 1A:
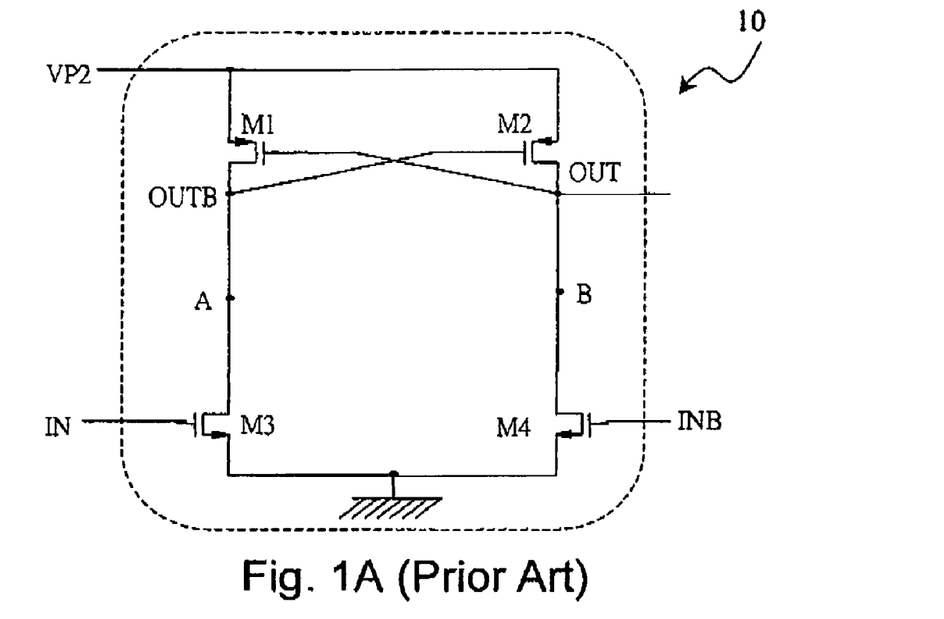
FIG. 1A is a circuit diagram schematically showing a conventional level shift circuit.

A level shift circuit is for use to convert a DC voltage level from low to high (such as from 5V to 12V or 23V, etc.), or from high to low (such as from 12V to 5V or 3V, etc.); a level shift circuit is often used in a power control circuit chip. FIG. 1A shows the basic structure of a conventional level shift circuit 10, which comprises two PMOS transistors M1 and M2, and two NMOS transistors M3 and M4. Assuming the function of the circuit is to convert the voltage level from 5V to 23V, the input IN in the shown circuit may thus be an operational voltage of 5V (the first operational voltage), and the voltage supplied from the voltage source VP2 may be 23V (the second operational voltage).

Figure 1B:
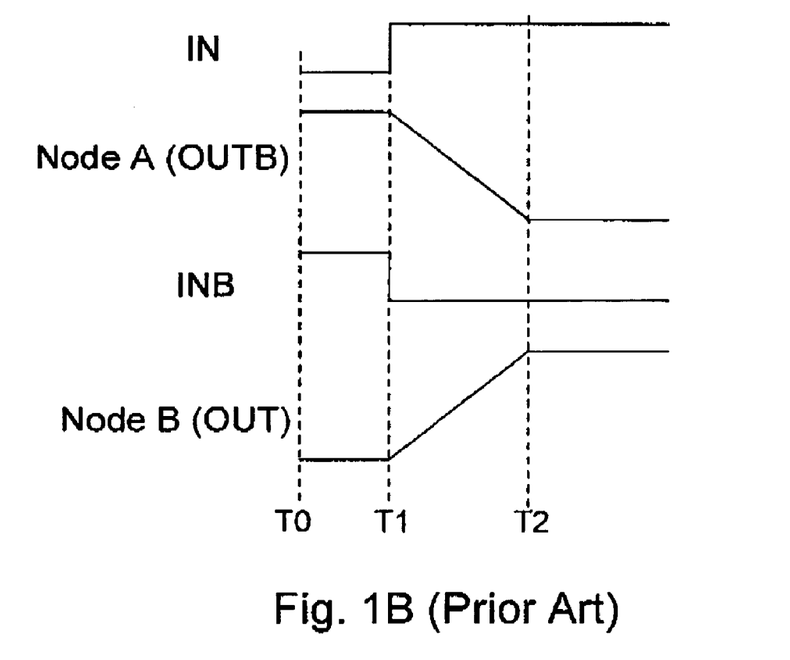
FIG. 1B is a time diagram showing the voltage level transition of the critical nodes in the conventional level shift circuit shown in FIG. 1A.

Referring to FIGS. 1A and 1B, the conventional level shift circuit operates as follows. At time T0, the initial state of the circuit, the input IN is at the low level of the first operational voltage (e.g., 0V), while the inverted input INB is at the high level of the first operational voltage (e.g., 5V). Because the inverted input INB is at the high level, the NMOS transistor M4 is ON, whereby the node B is grounded through NMOS transistor M4 and is at the low level of 0V. The voltage level of the node B is exactly the voltage level of the output OUT, which is thus also at the low level of 0V. Because the node B is low, the PMOS transistor M1 is ON, whereby the voltage VP2 reaches the node A through the PMOS transistor M1 so that the node A is at a high level equivalent to VP2 (the high level of the second operational voltage, such as 23V). Because the node A is high, PMOS transistor M2 is OFF; the voltage VP2 does not affect the voltage level at the output OUT.

When it is desired for the circuit to generate a high voltage level output, as shown at time T1 in FIG. 1B, the input IN switches from low to high, whereby the NMOS transistor M3 turns ON so that the node A is grounded through NMOS transistor M3. However, during the transition state, the PMOS transistor M1 is still partially conductive, and therefore the voltage VP2 still affects the node A; the voltage at the node A does not reach low instantly, but rather drops slowly. The PMOS transistor M2 is controlled by the node A and thus gradually turns ON until time T2. At time T2, the PMOS transistor M2 fully turns ON, and from this time on the voltage VP2 completely passes through the PMOS transistor M2 and reaches the node B so that the output OUT is pulled high to a level equivalent to VP2. In the meantime, since the node B is high, the PMOS transistor M1 fully turns OFF to stabilize node A at the low level of 0V.

As seen from the foregoing description and FIG. 1B, in such a conventional level shift circuit, there is a considerable time delay from the time T1 when the input IN switches to high, till the time T2 when the output OUT reaches high. The time delay is even longer if the level gap between the first and the second operational voltages is considerably large, which is of course undesirable.

In view of the foregoing drawback, the present invention proposes a level shift circuit, which is capable of speeding up the switching time of the PMOS transistors M1 and M2 to thereby speed up output voltage level switching.

SUMMARY OF THE INVENTION

A first objective of the present invention is to provide a level shift circuit which provides current to its output terminal from the source of the second operational voltage to speed up the output voltage level switching.

A second objective of the present invention is to provide a level shift circuit which stops excess power consumption after the completion of output voltage level switching.

A third objective of the present invention is to provide a method to achieve faster output voltage level switching with reduced power consumption.

To achieve the foregoing objectives, according to an aspect of the present invention, a level shift circuit comprises: level shift means for converting an input of a first operational voltage to an output of a second operational voltage, and a current path connecting with a source of the second operational voltage and providing current to an output terminal of the level shift means for speeding up output voltage level switching.

Preferably, a control path may be provided to control the current flow on the current path. The control may be achieved by, e.g., a current mirror.

According to another aspect of the present invention, the level shift circuit preferably comprises a power consumption control circuit which stops excess power consumption when the output terminal of level shift means has completed voltage level switching.

The power consumption control circuit may be embodied by a charge storage circuit.

For better understanding the objects, characteristics, and effects of the present invention, the present invention will be described below in detail by illustrative embodiments with reference to the attached drawings.

DESCRIPTION OF THE PREFERRED EMBODIMENTS

For purpose of simplicity, in all of the following embodiments, it is assumed that the first operational voltage is 5V and the second operational voltage VP2 is 23V. However, the present invention should not be limited to such arrangement, but may be applied to level shift between any two voltage levels.

Figure 2:
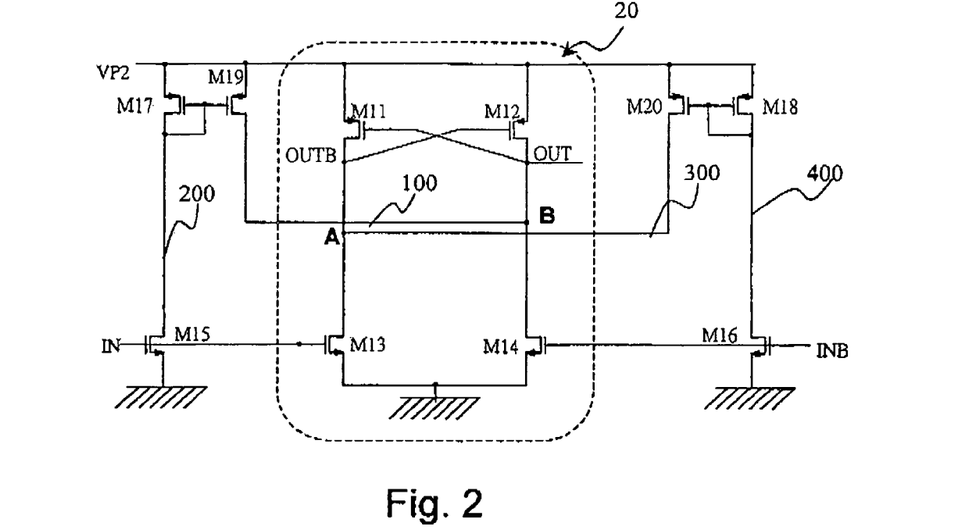
FIG. 2 is a circuit diagram schematically showing a level shift circuit according to a first preferred embodiment of the present invention.

FIG. 2 schematically shows a first preferred embodiment according to the present invention. As shown in the figure, a level shift circuit comprises a pair of PMOS transistors M11 and M12, and a pair of NMOS transistors M13 and M14 (the PMOS and NMOS pairs constituting basic level shift means 20). In addition to the above, the level shift circuit according to this embodiment further comprises a current path 100 (VP2-M19-node B) which is connected to the source for supplying the second operational voltage VP2. The current path serves to pull high the voltage level at the node B, as explained below.

More specifically, referring to FIG. 2, when the input IN switches from low to high, besides the transistor M13 turns ON and the transistor M14 turns OFF, the transistor M15 also turns ON, so there is current flowing on the path 200; this current is proportionally duplicated on the path 100 (i.e., current is generated on the path 100 in proportion to the current on the path 200) by means of a current mirror consisting of transistors M17 and M19. The current on the path 100 flows to the node B to pull high the voltage level at the output OUT, speeding up the level switching thereat. In the mean time, the PMOS transistor M11 turns OFF more rapidly, so that the voltage at the node A rapidly drops to a stable 0V level, whereby the PMOS transistor M12 completely turns ON to stabilize the high voltage level at the output OUT and the node B.

The circuit operates in a similar fashion when the input IN switches from high to low. Correspondingly, the inverted input INB switches from low to high to turn ON the transistor M16, whereby current flows on the path 400; this current is proportionally duplicated on the path 300 by means of a current mirror consisting of transistors M18 and M20. The current on the path 300 flows to the node A so that the PMOS transistor M12 rapidly turns OFF, and the output OUT rapidly drops to a stable 0V level.

According to simulation experiments by the inventors, in an application for level shift between an input of 5V and an output of 23V, the circuit according to the present invention can speed up the output voltage level switching 30 times faster than that of a conventional circuit.

In the circuit shown in FIG. 2, when the output OUT has reached high, there is still current flowing on the path 200 (and similarly, when the output OUT has reached low, there is still current flowing on the path 400), resulting in undesired power consumption. Therefore, the circuit shown in FIG. 2 may be further improved.

Figure 3:
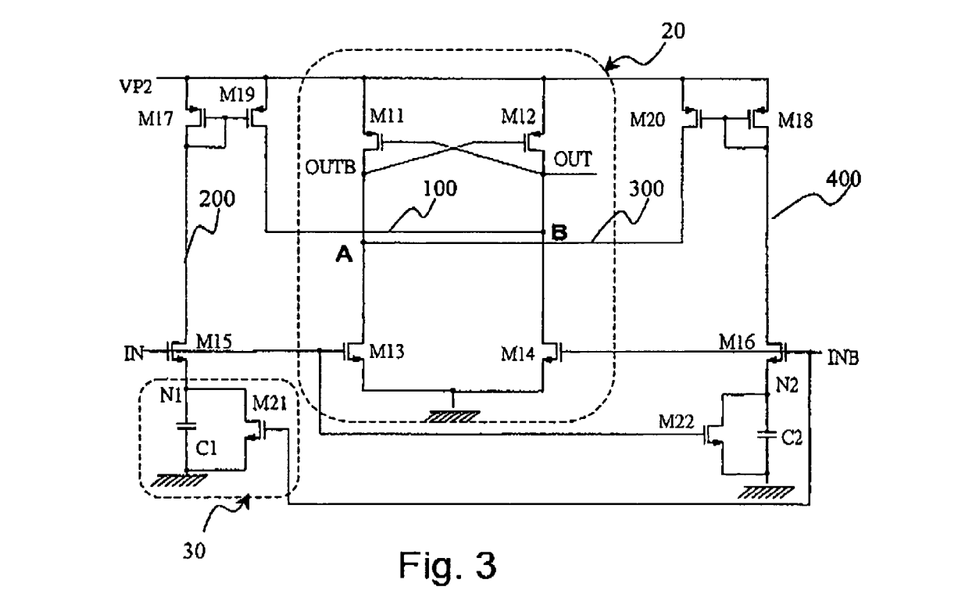
FIG. 3 is a circuit diagram schematically showing a level shift circuit according to a second preferred embodiment of the present invention.

FIG. 3 schematically shows a second preferred embodiment according to the present invention, which is different from the embodiment shown in FIG. 2 in that a power consumption control circuit 30 is provided below the transistor M15. In this embodiment, the circuit 30 is embodied as a charge storage circuit which automatically turns OFF the transistor M15 by means of the stored charges. More specifically, when the input IN switches from low to high, the transistor M15 turns ON and there is current flowing on the path 200; however, this current is not simply grounded and lost, but instead charges a capacitor C1. Accumulated charges in the capacitor C1 increase the voltage level at the node N1, so that the gate-to-source voltage $V_{GS}$ of the transistor M15 drops; at the time point when the voltage level at the node N1 reaches high, the transistor M15 automatically turns OFF to shut down the current path 200, and correspondingly, there is no current flowing on the current path 100. In other words, in this embodiment, current flow on the paths 100 and 200 only during the transition state, and after the output voltage level switching has completed, the circuit does no more consume any power.

When the input IN switches from high to low, the inverted input INB correspondingly switches to high; the transistor M15 turns OFF, but the transistor M21 turns ON. The capacitor C1 discharges through the conducting transistor M21. The purpose of this mechanism is to reset the node N1 to low before the next cycle, i.e., before the input IN switches from low to high next time, so that the transistor M15 will not stay in the OFF state due to $V_{GS}$ being smaller than the threshold voltage.

The capacitance of the capacitor C1 in the above-mentioned circuit can be determined according to the current desired to be supplied to the node B through the path 100, and the parasitic capacitance of the path 200. Nevertheless, the choice of the capacitance is not critical to this invention, because even if the chosen capacitance is not optimum, the circuit still serves to speed up the output voltage level switching, and to reduce power consumption.

Likely, as shown in the lower-right part of the figure, the capacitor C2 and the transistor M22 provide similar charging and discharging functions so that when the inverted input INB switches from low to high, the capacitor C2 is charged to decrease the gate-to-source voltage $V_{GS}$ of the transistor M16, until the transistor M16 turns OFF to shut down the current on the paths 400 and 300. And when the inverted input INB switches from high to low, the transistor M16 turns OFF, but the transistor M22 turns ON. The capacitor C2 discharges through the conducting transistor M22 to reset the node N2 to low before the next cycle, i.e., before the inverted input INB switches from low to high next time.

Figure 4:
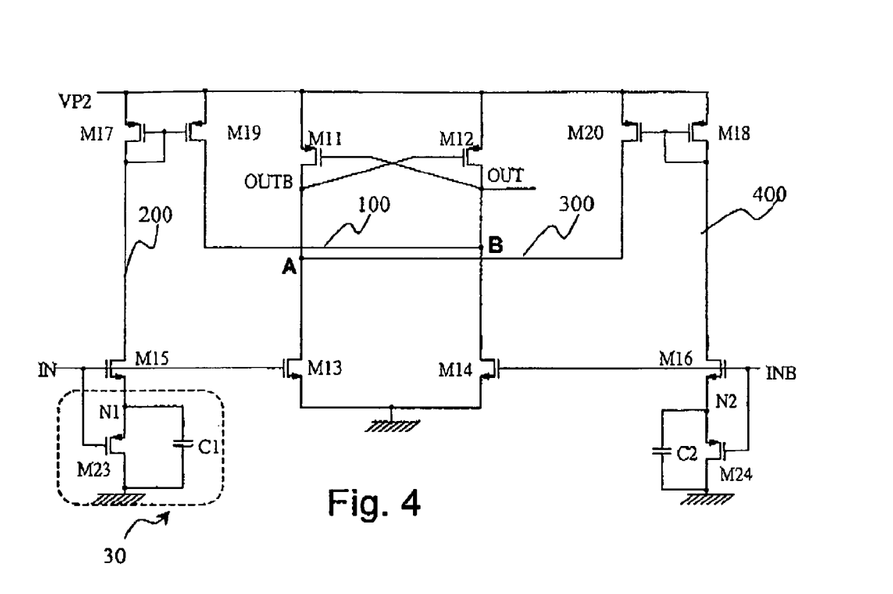
FIG. 4 is a circuit diagram schematically showing a level shift circuit according to a third preferred embodiment of the present invention.

It is readily conceivable that the NMOS transistors M21 and M22 in the circuit shown in FIG. 3 may be replaced by PMOS transistors, as shown by the PMOS transistors M23 and M24 in FIG. 4. In this embodiment, the gates of the PMOS transistors M23 and M24 should be controlled by the input IN and the inverted input INB, respectively.

Figure 5:
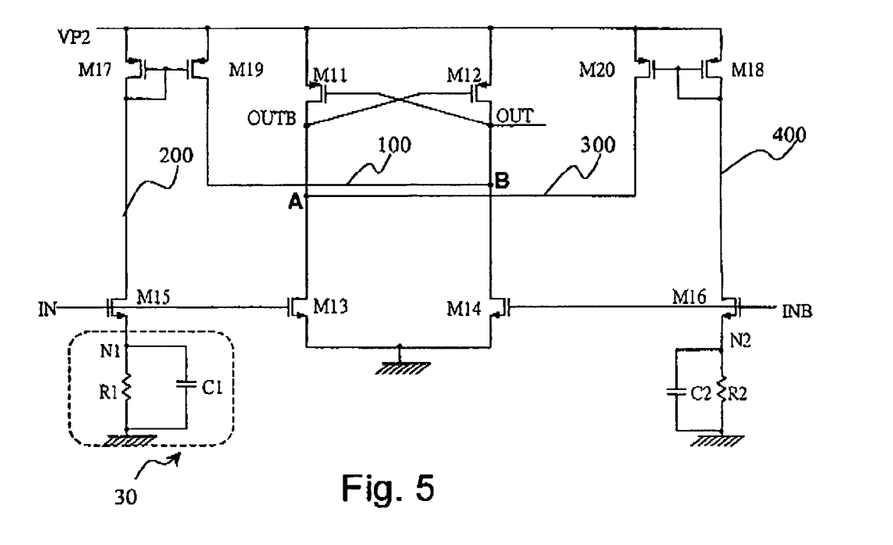
FIG. 5 is a circuit diagram schematically showing a level shift circuit according to a fourth preferred embodiment of the present invention.

As another example, the circuits shown in FIGS. 3 and 4 may be replaced by the circuit as shown in FIG. 5, wherein the NMOS transistors M21 and M22, or the PMOS transistors M23 and M24, are replaced by resistors R1 and R2. In this embodiment, preferably, the resistance of the resistor R1 is relatively large so that when the transistor M15 turns ON, most of the current flows through the path with the capacitor C1 to charge it. When the transistor M15 turns OFF, the capacitor C1 discharges through the resistor R1. The capacitor C2 and the resistor R2 at the right side of FIG. 5 operate in a similar fashion. Thus, the circuit according to this embodiment provides a similar function to that of the circuits shown in FIGS. 3 and 4.

Figure 6:
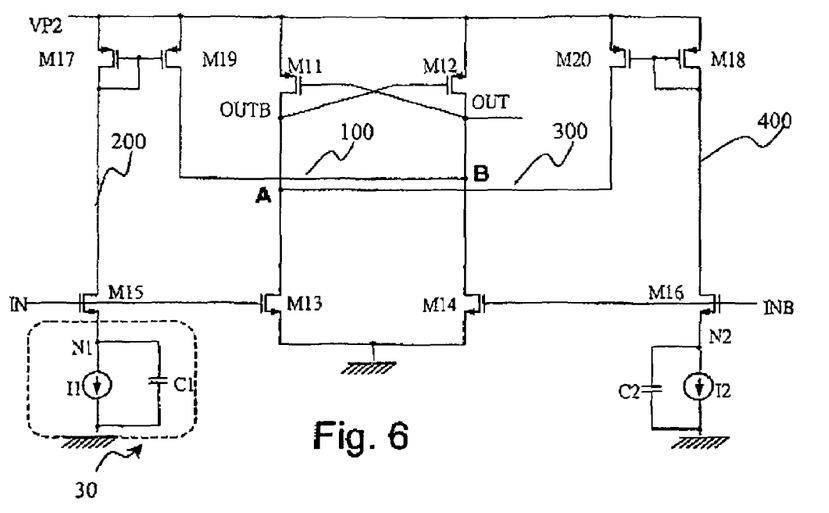
FIG. 6 is a circuit diagram schematically showing a level shift circuit according to a fifth preferred embodiment of the present invention.

Alternatively, the circuit shown in FIG. 5 may be modified as shown in FIG. 6, wherein the resistors R1 and R2 are replaced by constant current sources I1 and I2. Preferably, the current amount determined by the constant current sources I1 and I2 should be relatively small, so that most current flows through the capacitors C1 and C2 to charge them. The circuit according to this embodiment also provides a similar function to that of the circuits shown in FIGS. 3 and 4.

Figure 7:
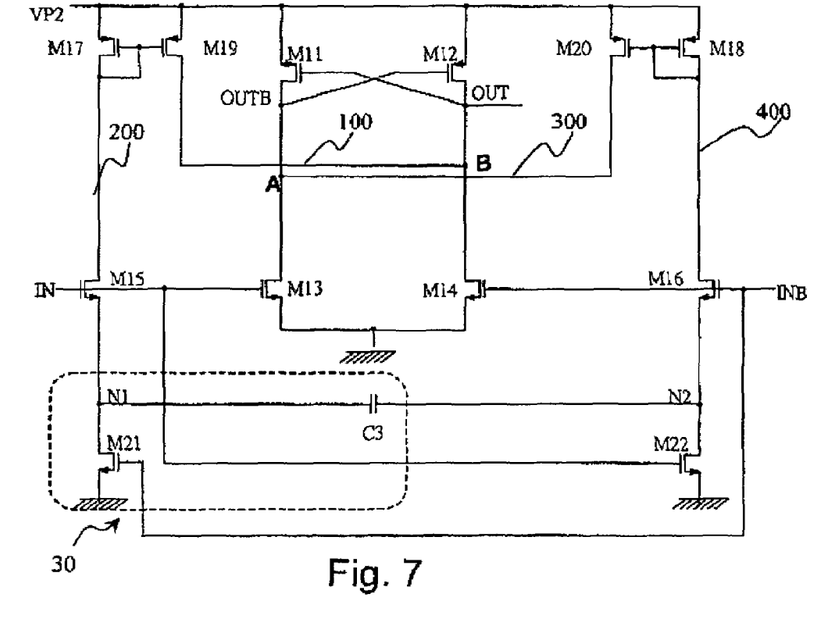
FIG. 7 is a circuit diagram schematically showing a level shift circuit according to a sixth preferred embodiment of the present invention.

In the circuits shown in FIGS. 3 and 4, only one of the NMOS transistors M21 and M22, or one of the PMOS transistors M23 and M24 is conductive at the same time point. Therefore, it is not necessarily required to provide two capacitors C1 and C2. The circuit of FIG. 3 may be modified as the circuit shown in FIG. 7, wherein a common capacitor C3 replaces for the capacitors C1 and C2, to reduce the area occupied by the circuit in an integrated circuit chip. In this embodiment, when the input IN switches to high, the transistors M15 and M22 turns ON while the transistor M16 and M21 turns OFF, so the capacitor C3 is charged from the node N1 toward the node N2. When the input IN switches to low, the transistors M16 and M21 turns ON while the transistor M15 and M22 turns OFF, so the capacitor C3 first discharges through the transistor M21, and thereafter is charged from the node N2 toward the node N1. Eventually the voltage level at the node N2 will be higher than that at the node N1. Thus, the circuit shown in FIG. 7 also provides a similar function to that of the circuit shown in FIG. 3.

As apparent to one skilled in this art, the circuit shown in FIG. 4 may be similarly modified. The details thereof are omitted here.

One primary purpose of the embodiments described with reference to FIGS. 3-7 is to stop the current flow on the path 200 or 400 after the output OUT has completed voltage level switching, to thereby reduce power consumption. As illustrated, this is done by means of a charge storage circuit, wherein the voltage level at the node N1 or N2 is increased due to accumulated charges in the capacitor C1 or C2 (or C3), so that the transistor M15 or M16 automatically turns OFF. However, there are other ways to achieve the same result. For example, one may use the voltage level at the node A to control the NMOS transistor M21, as shown in FIG. 8; or, one may use the voltage level at the node B to control the PMOS transistor M23, as shown in FIG. 9.

Figure 8:
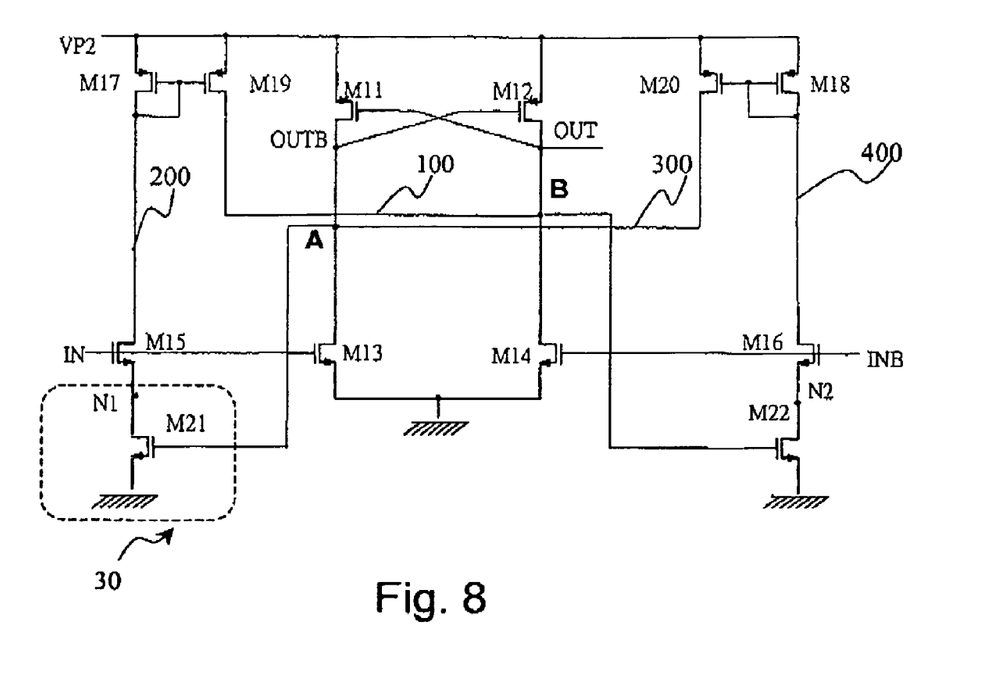
FIG. 8 is a circuit diagram schematically showing a level shift circuit according to a seventh preferred embodiment of the present invention.

More specifically, in the circuit shown in FIG. 8, when the input IN switches from low to high, the voltage level at the node A drops but has not yet reached low, so the NMOS transistor M21 is still partially conductive, and there is still current flowing on the path 200. This current is proportionally duplicated to the path 100; the current on the path 100 flows to the node B to speed up the voltage level switching at the output OUT. When the voltage level at the output OUT reaches high, the PMOS transistor M11 fully turns OFF, whereby the voltage level at the node A drops to 0V, and the NMOS transistors M21 fully turns OFF. The path 200 is thus open and does not consume more power. Likely, when the input IN switches from high to low, the inverted input INB switches from low to high, and the right side of the circuit functions in a similar fashion.

Figure 9:
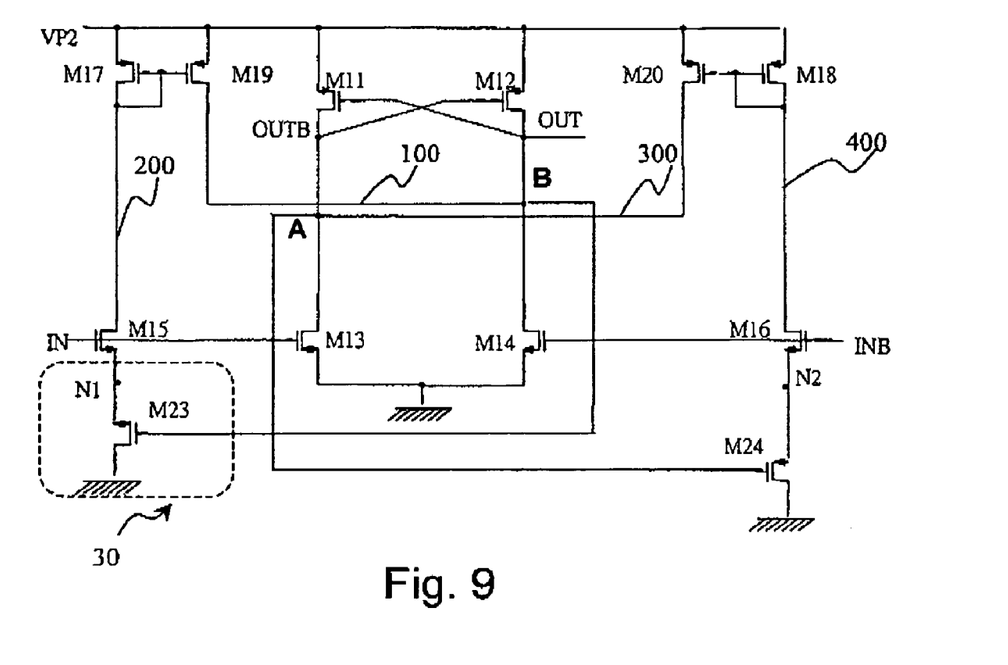
FIG. 9 is a circuit diagram schematically showing a level shift circuit according to an eighth preferred embodiment of the present invention.

In the circuit shown in FIG. 9, when the input IN switches from low to high, the voltage level at the node B increases but has not yet reached high, so the PMOS transistor M23 is still partially conductive, and there is still current flowing on the path 200. This current is proportionally duplicated to the path 100; the current on the path 100 flows to the node B to speed up the voltage level switching at the output OUT. When the voltage level at the output OUT reaches high, the PMOS transistor M23 fully turns OFF, whereby the path 200 is open and does not consume more power. Likely, when the input IN switches from high to low, the inverted input INB switches from low to high, and the right side of the circuit functions in a similar fashion.

In the circuits shown in FIGS. 8 and 9, the NMOS transistors M21 and M22, or the PMOS transistors M23 and M24, should be transistor devices capable of sustaining the second operational voltage.

Figure 10:
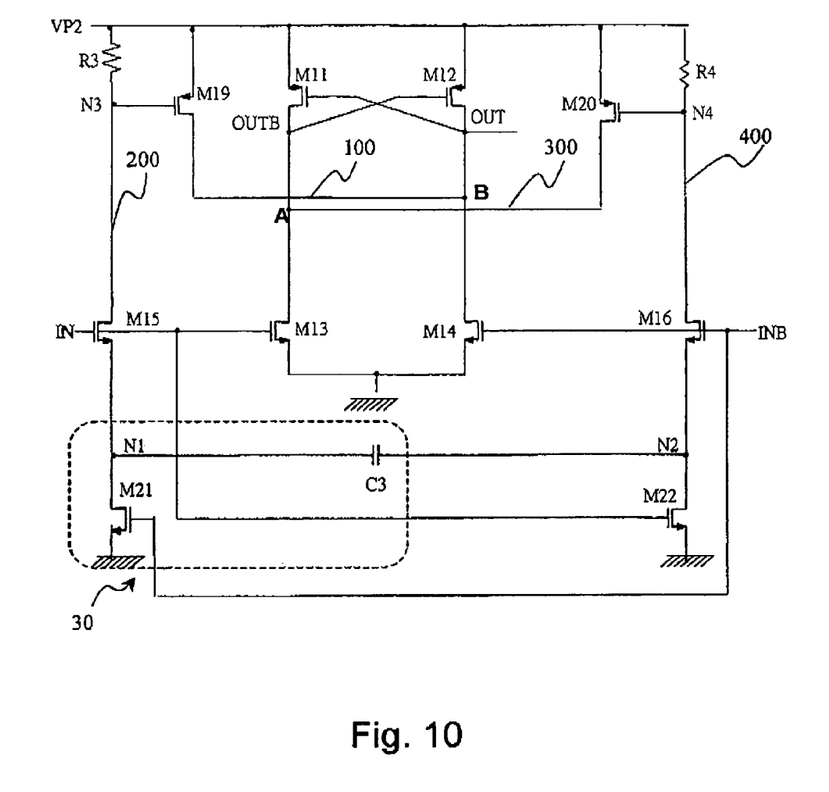
FIG. 10 is a circuit diagram schematically showing a level shift circuit according to a ninth preferred embodiment of the present invention.

In addition to the above-mentioned embodiments, there are still other alternatives to achieve substantially the same function. For example, it does not necessarily have to use a current mirror to duplicate and provide current to the node B (the output OUT). As shown in FIG. 10, the transistors M17 and M18 in the FIG. 7 may be replaced by resistors R3 and R4, to achieve substantially the same function. (The lower part of the circuit may be replaced by a corresponding part shown in any of the FIGS. 2-6, 8 and 9.)

More specifically, in the circuit shown in FIG. 10, when the input IN switches from low to high, the NMOS transistor M15 turns ON. The resistor R3 provides a voltage drop so that the voltage level at the node N3 is at a relatively low level; the conduction of the transistor M15 further pulls down the voltage level at the node N3, whereby the PMOS transistor M19 turns ON. The ratio of current flowing from the source of the second operational voltage VP2 to the path 200 and that to the path 100 may be adjusted by properly designing the resistance of the resistor R3; preferably, one may assign a higher resistance to the path 200 and a lower resistance to the path 100, so that more current flows to the node B through the path 100, to thereby speed up the output voltage level switching. When the input IN switches from high to low, the inverted input INB correspondingly switches from low to high; the voltage level at the node A is pulled high in a similar fashion by the right side of the circuit, whereby the PMOS transistor M12 turns OFF rapidly so that the voltage level at the output OUT rapidly reaches a stable low level of 0V.

Figure 11:
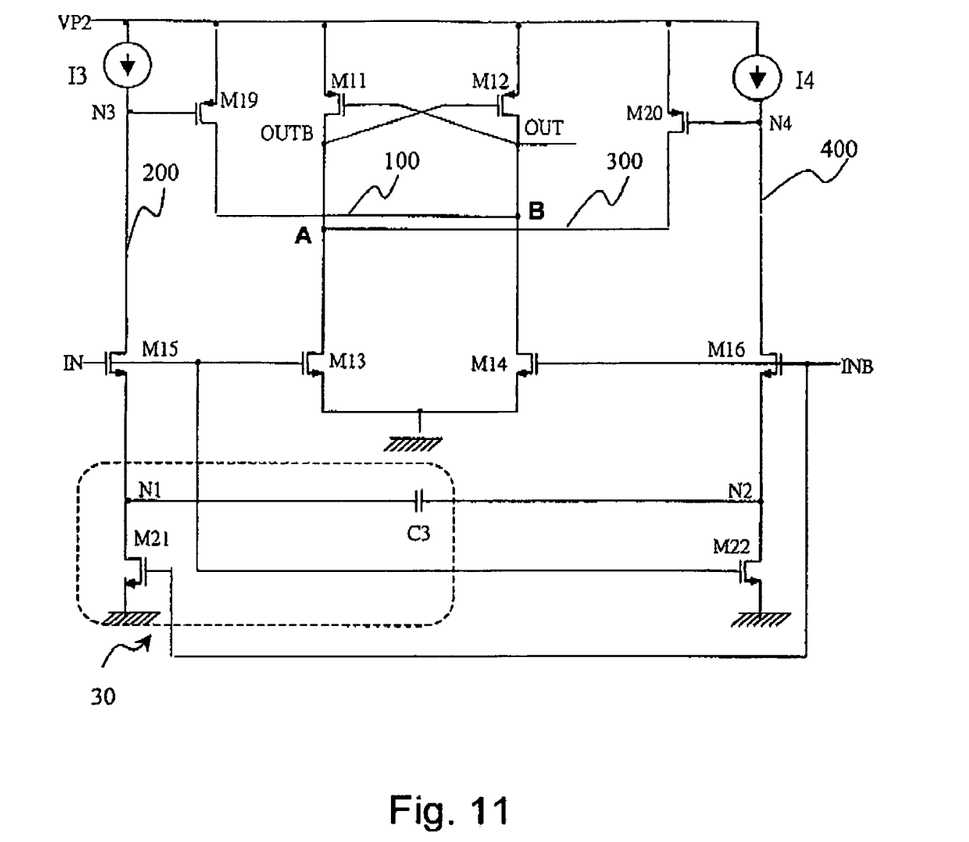
FIG. 11 is a circuit diagram schematically showing a level shift circuit according to a tenth preferred embodiment of the present invention.

It may be readily conceived by one skilled in this art to modify the circuit shown in FIG. 10 as the circuit shown in FIG. 11, wherein the resistors R3 and R4 are replaced by a pair of weak constant current sources I3 and I4. In this embodiment, when the input IN switches from low to high, since the current provided by the current source I3 is smaller than the current flowing out through the conduction of the NMOS transistor M15, the voltage level at the node N3 drops rapidly, whereby the PMOS transistor M19 turns ON. In the paths 200 and 100, the current amount in the path 200 is limited by the current source I3, so more current flows to the node B through the path 100, to speed up the output voltage level switching. When the input IN switches from high to low, the right side of the circuit functions in a similar fashion so that the voltage level at the output OUT rapidly reaches a stable low level of 0V.

In summary, one of the primary features of the present invention is to provide a current path which provides current from a source of the second operational voltage to the output of the level shift circuit, to thereby speed up output voltage level switching; under the same spirit, one skilled in this art may readily think of many equivalents which should fall in the scope of the present invention. Another primary feature of the present invention is to provide a power consumption control circuit which automatically stops excess power consumption when the output has accomplished level switching; under the same spirit, likely, one skilled in this art may readily think of many equivalents which should fall in the scope of the present invention.

The features, characteristics and effects of the present invention have been described with reference to its preferred embodiments, which are illustrative of the invention rather than limiting of the invention. Various other substitutions and modifications will occur to those skilled in the art, without departing from the spirit of the present invention. For example, in each of the described embodiments, the level shift circuit is for converting a low voltage level to a high voltage level, but the present invention may be applied to a level shift circuit for high-to-low level shift as well. As another example, although it is preferred to turn OFF the transistors M15 and M16 at the time when the output OUT accomplishes level switching, it may be arranged so that the transistors M15 and M16 are turned OFF earlier or later. As a further example, although all the shown circuit embodiments are symmetrical, it may be arranged so that a level shift circuit is asymmetrical, i.e., besides the basic level shift means, the circuit only includes the left side of the right side of what is shown in any of the embodiments, to speed up output level switching either from low to high or from high to low, but not both. Therefore, all such substitutions and modifications are intended to be embraced within the scope of the invention as defined in the appended claims.

What is claimed is:

1. A level shift circuit comprises:
level shift means for converting an input of a first operational voltage to an output of a second operational voltage, and
a first current path connecting with a source of said second operational voltage and providing current to an output terminal of said level shift means for speeding up output voltage level switching,
wherein said first current path is controlled by a first control path which is connected with a charge storage circuit, whereby when said output of said level shift means has substantially accomplished voltage level switching, said charge storage circuit shuts down said first control path.

2. The level shift circuit of claim 1, wherein
said first current path includes a current path switch, and
said first control path includes:
a control path switch which operates according to the voltage level of said input of said first operational voltage, and
a resistor having a first terminal connected with said source of said second operational voltage, and a second terminal controlling said current path switch, said second terminal being also connected with said control path switch.

3. The level shift circuit of claim 1, wherein
said first current path includes a current path switch, and
said first control path includes:
a control path switch which operates according to the voltage level of said input of said first operational voltage, and
a constant current source having a first terminal connected with said source of said second operational voltage, and a second terminal controlling said current path switch, said second terminal being also connected with said control path switch.

4. The level shift circuit of claim 1, wherein said charge storage circuit includes a constant current source.

5. A level shift circuit comprises:
level shift means for converting an input of a first operational voltage to an output of a second operational voltage, and
a first current path connecting with a source of said second operational voltage and providing current to an output terminal of said level shift means for speeding up output voltage level switching,
wherein said first current path is controlled by a first control path which is connected with a first power consumption control circuit, whereby when said output of said level shift means has substantially accomplished voltage level switching, said first power consumption control circuit shuts down said first control path, and
wherein said level shift means further includes an inverted output terminal generating an inverted output; and wherein said level shift circuit further includes a second current path connected with said source of said second operational voltage and providing current to said inverted output terminal of said level shift means;
said second current path being controlled by a second control path which is connected with a second power consumption control circuit, whereby when said inverted output of said level shift means has substantially accomplished voltage level switching, said second power consumption control circuit shuts down said second control path;
said first and second power consumption control circuits sharing a common capacitor.

6. A method to speed up output voltage level switching in a level shift circuit, comprising:
providing a source of a first operational voltage and a source of a second operational voltage;
providing level shift means for converting an input of said first operational voltage to an output of said second operational voltage;
providing current to an output terminal of said level shift means from said source of said second operational voltage;
providing a control path for initiating or stopping said step of providing current to said output terminal of said level shift means, said control path including a MOS transistor switch; and
shutting down said MOS transistor switch by reducing the gate-to-drain voltage difference thereof when said output of said level shift means has substantially accomplished voltage level switching.

7. The method of claim 6, wherein said control path further includes a charge storage circuit serially connected with said MOS transistor switch, and wherein said step of shutting down said MOS transistor switch includes: reducing the gate-to-drain voltage difference of said MOS transistor switch by charging said charge storage circuit, to thereby turn OFF said MOS transistor switch.

* * * * *

UNITED STATES PATENT AND TRADEMARK OFFICE
CERTIFICATE OF CORRECTION

PATENT NO. : 7,382,172 B2
APPLICATION NO. : 11/497587
DATED : June 3, 2008
INVENTOR(S) : Pao-Chuan Lin It is certified that error appears in the above-identified patent and that said Letters Patent is hereby corrected as shown below:

Delete claims 6-7, and insert claims 6-7 as shown:

6. A method to speed up output voltage level switching in a level shift circuit, comprising:
providing a source of a first operational voltage and a source of a second operational voltage;
providing level shift means for converting an input of said first operational voltage to an output of said second operational voltage;
providing current to an output terminal of said level shift means from said source of said second operational voltage;
providing a control path for initiating or stopping said step of providing current to said output terminal of said level shift means, said control path including a MOS transistor switch; and
shutting down said MOS transistor switch by reducing the ~~gate-to-drain~~ gate-to-source voltage difference thereof when said output of said level shift means has substantially accomplished voltage level switching.

7. The method of claim 6, wherein said control path further includes a charge storage circuit serially connected with said MOS transistor switch, and wherein said step of shutting down said MOS transistor switch includes:
reducing the ~~gate-to-drain~~ gate-to-source voltage difference of said MOS transistor switch by charging said charge storage circuit, to thereby turn OFF said MOS transistor switch.

Signed and Sealed this

Ninth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,382,172 B2  
APPLICATION NO. : 11/497587  
DATED : June 3, 2008  
INVENTOR(S) : Pao-Chuan Lin Page 1 of 1

It is certified that error appears in the above-identified patent and that said Letters Patent is hereby corrected as shown below:

Column 8, lines 32-57, Delete claims 6-7, and insert claims 6-7 as shown:

--6. A method to speed up output voltage level switching in a level shift circuit, comprising:
providing a source of a first operational voltage and a source of a second operational voltage;
providing level shift means for converting an input of said first operational voltage to an output of said second operational voltage;
providing current to an output terminal of said level shift means from said source of said second operational voltage;
providing a control path for initiating or stopping said step of providing current to said output terminal of said level shift means, said control path including a MOS transistor switch; and
shutting down said MOS transistor switch by reducing the ~~gate-to-drain~~ gate-to-source voltage difference thereof when said output of said level shift means has substantially accomplished voltage level switching.

7. The method of claim 6, wherein said control path further includes a charge storage circuit serially connected with said MOS transistor switch, and wherein said step of shutting down said MOS transistor switch includes:
reducing the ~~gate-to-drain~~ gate-to-source voltage difference of said MOS transistor switch by charging said charge storage circuit, to thereby turn OFF said MOS transistor switch.--

This certificate supersedes the Certificate of Correction issued June 9, 2009.

Signed and Sealed this

Seventh Day of July, 2009

JOHN DOLL  
*Acting Director of the United States Patent and Trademark Office*

UNITED STATES PATENT AND TRADEMARK OFFICE
CERTIFICATE OF CORRECTION

PATENT NO. : 7,382,172 B2
APPLICATION NO. : 11/497587
DATED : June 3, 2008
INVENTOR(S) : Pao-Chuan Lin It is certified that error appears in the above-identified patent and that said Letters Patent is hereby corrected as shown below:

Title Pg, Item (73) Assignee: Delete "Richtek Technology Company Ltd." and Insert -- Richtek Technology Corporation --.

Signed and Sealed this

Twenty-second Day of June, 2010

David J. Kappos
*Director of the United States Patent and Trademark Office*